United States Patent [19]
Furukawa et al.

[11] Patent Number: 5,956,597
[45] Date of Patent: Sep. 21, 1999

[54] METHOD FOR PRODUCING SOI & NON-SOI CIRCUITS ON A SINGLE WAFER

[75] Inventors: Toshiharu Furukawa, Essex Junction; Mark C. Hakey; Steven J. Holmes, both of Milton; David V. Horak, Essex Junction; Paul A. Rabidoux, Winooski, all of Vt.

[73] Assignee: International Business Machines Corporation, Armonk, N.Y.

[21] Appl. No.: 08/929,730

[22] Filed: Sep. 15, 1997

[51] Int. Cl.[6] ........................................ H01L 21/76
[52] U.S. Cl. .................. 438/405; 438/149; 438/154; 438/162; 438/219; 438/407; 438/404
[58] Field of Search .................... 438/149, 154, 438/162, 219, 221, 223, 224, 227, 228, 404, 405, 407

[56] References Cited

U.S. PATENT DOCUMENTS

| | | | |
|---|---|---|---|
| 5,399,507 | 3/1995 | Sun | 438/405 |
| 5,529,947 | 6/1996 | Okonogi | 438/405 |
| 5,573,972 | 11/1996 | Kobayashi | 438/405 |
| 5,726,089 | 3/1998 | Okonogi | 438/406 |

*Primary Examiner*—Trung Dang
*Attorney, Agent, or Firm*—Schmeiser, Olsen & Watts; Eugene I. Shkurko

[57] ABSTRACT

According to a preferred embodiment of the present invention, a stress-reducing region formed on a wafer allows standard bulk CMOS devices (non-SOI) devices and SOI devices to be reliably fabricated on the same wafer. The high-stress interface that typically exists between the SOI device regions and the non-SOI device regions is transferred to a region where the high-stress will be reduced and relaxed. Typically, this means that the high-stress interface will be fabricated so as to lie over a region of the wafer similar to Shallow Trench Isolation (STI) regions. In addition, by using another preferred embodiment of the present invention, a coplanar wafer surface can be maintained for a wafer which includes both bulk CMOS devices and SOI devices. This is accomplished by etching the silicon wafer in the SOI device regions prior to the oxygen implantation so that the surface of the area between the stress interface regions is lower than the overall surface of the remainder of the wafer. Then, when the $SiO_2$ region is formed for the SOI devices, the expansion of the SOI region will bring the surface of the SOI device area up to the overall surface of the wafer. A short Chemical Mechanical Polish (CMP) step may also be included to ensure uniformity of the wafer's surface.

20 Claims, 6 Drawing Sheets

METHOD FOR PRODUCING SOI & NON-SOI CIRCUITS ON A SINGLE WAFER

BACKGROUND OF THE INVENTION

1. Technical Field

This invention generally relates to the fabrication of integrated circuits. More specifically, the present invention relates to the fabrication of Silicon On Insulator (SOI) devices and non-SOI devices.

2. Background Art

Today, our society is heavily dependent on high-tech electronic devices for everyday activity. Integrated circuits are the components that give life to our electronic devices. Integrated circuits are found in widespread use throughout our country and the world, in appliances, in televisions and personal computers, and even in automobiles. Additionally, manufacturing and production facilities are becoming increasingly dependent on the use of integrated circuits for operational and production efficiencies. Indeed, in many ways, our everyday life could not function as it does without integrated circuits. These integrated circuits are manufactured in huge quantities in our country and abroad and improved manufacturing processes have led to drastic price reductions for these devices.

The traditional integrated circuits fabrication process is a series of steps by which a geometric pattern or set of geometric patterns is transformed into an operating integrated circuit. An integrated circuit consists of superimposed layers of conducting, insulating, and transistor-forming materials, usually formed on a silicon wafer substrate. By arranging predetermined geometric shapes in each of these superimposed layers, an integrated circuit that performs the desired function may be constructed. The overall fabrication process typically consists of the patterning of a particular sequence of successive layers using various chemicals as etchants, used to remove portions of the various layers. Many different processes exist for creating a pattern on the underlying silicon wafer, with different processes being specifically adapted to produce the desired type of integrated circuit.

Recently, a number of processes have been developed for fabricating certain integrated circuit devices commonly known as Silicon On Insulator (SOI) devices. SOI devices are semiconductor devices fabricated within a thin silicon layer that overlies an electrically insulating region formed over a substrate material. This insulating region may include, for example, a layer of $SiO_2$ deposited over a semiconductor substrate material such as silicon or gallium arsenide. The SOI fabrication process allows circuit devices to be created which are electrically isolated from the underlying substrate. SOI devices offer several advantages over more conventional semiconductor devices.

For example, SOI devices will generally have lower power consumption requirements than other types of devices which perform similar tasks. SOI devices will also typically have lower parasitic capacitances which, in turn, translate into faster switching times for the resulting circuits. In addition, the well-known but undesirable phenomenon of "latchup," which is often exhibited by more conventional Complementary Metal-Oxide Semiconductor (CMOS) devices, is avoided when circuit devices are manufactured using SOI fabrication processes. SOI devices are also less susceptible to the adverse effects of ionizing radiation and, therefore, tend to be more reliable in applications where ionizing radiation may cause operation errors.

The many advantages listed above have led to the rapid acceptance of SOI devices in various integrated circuit applications. With the increasing popularity of lightweight, portable, and mobile electronic devices such as cellular phones, Personal Digital Assistants (PDAs), and notebook computers, the low power consumption features of SOI devices have made them a popular design choice for many products. SOI devices have proven especially popular in circuit applications where switching speed is most desirable and advantageous. These applications include circuits such as memory support circuits and Central Processing Unit (CPU) circuits. By implementing these circuit designs using SOI devices, the operational speed of the individual circuits can be greatly enhanced, thereby increasing overall product performance.

While increasingly popular, SOI devices are not useful in all circuit applications. Certain limitations in the operational characteristics of SOI devices make SOI devices unacceptable in certain circuit designs. For example, during operation of a typical SOI transistor, electrical charges can accumulate in the transistor, until the concomitant electrical potential increases sufficiently to produce a shift in the threshold voltage ($V_T$) of the transistor. This shift can adversely affect the operation of the circuit and introduce errors into the information being processed by the device. Depending on the tolerance level for critical errors, this may or may not be acceptable in a given circuit application.

In addition, the fabrication process for manufacturing SOI devices is not without certain limitations. In general, the fabrication process for SOI devices produces more defective circuits from a given wafer than non-SOI device fabrication processes, thereby decreasing yield. The defects are created during the formation of the electrically insulating region that characterizes SOI devices. Further, some circuits in certain applications are especially defect sensitive and SOI devices do not work well in many of these applications. One example of this type of circuit application is Dynamic Random Access Memory (DRAM). Because of these limitations, most circuit designers have found it advantageous to use a combination of both SOI and non-SOI devices in many circuit applications, selecting the best technology for a given application.

Obviously, fabricating complete circuits, using both SOI devices and non-SOI devices on a single wafer would provide the most advantageous solution for circuit designers. However, while it may be desirable to improve manufacturing efficiencies by fabricating SOI devices and non-SOI devices on a single wafer, conventional wafer processing techniques make this task very difficult, if not impossible, to accomplish. Current processing techniques used to fabricate SOI devices and non-SOI devices on the same wafer invariably result in high stress areas on the wafer surface which eventually result in catastrophic failure of the circuits on the wafer. This problem is explained below.

When a combination SOI device and non-SOI device wafer is fabricated, the SOI device formation process involves heating the wafer at a temperature of approximately 650° C.–750° C. and implanting large quantities of oxygen below the surface of the wafer in areas where the SOI devices are to be formed. The wafer is then heated to approximately 1350° C. for an extended period of time. It is during this heating cycle that the $SiO_2$ is formed in the wafer. Basically, the elevated temperature induces a chemical reaction between the implanted oxide and the silicon in the wafer substrate, thereby producing $SiO_2$. Since the $SiO_2$ takes up a significantly larger amount of space on the wafer than the underlying silicon in substrate from which it was formed, structural differences in the two regions result in a high-stress area just below the surface of the wafer. This in turn, will produce Si defects which may, in turn, cause circuit failure. Given these existing limitations, fabricating commercially significant quantities of SOI devices and non-SOI devices on the same wafer is presently impractical.

Therefore, there exists a need to provide a practical method for fabricating SOI devices and non-SOI devices on a single wafer which would allow integrated circuit designers additional flexibility in creating new and more powerful integrated circuits. Without providing a method of fabricating SOI and non-SOI devices on the same wafer, certain advances in integrated circuit design, fabrication, and application will continue to be unnecessarily limited.

DISCLOSURE OF INVENTION

According to a preferred embodiment of the present invention, a stress-reducing region formed on a wafer allows standard bulk CMOS (non-SOI) devices and SOI devices to be reliably fabricated on the same wafer. The high-stress interface that typically exists between the SOI device regions and the non-SOI device regions is transferred to a region where the high-stress will be reduced and relaxed. Typically, this means that the high-stress interface will be fabricated so as to lie over a region of the wafer similar to Shallow Trench Isolation (STI) regions. In addition, by using another preferred embodiment of the present invention, a coplanar wafer surface can be maintained for a wafer which includes both bulk CMOS devices and SOI devices. This is accomplished by etching the silicon wafer in the SOI device regions prior to the oxygen implantation so that the surface of the area between the stress interface regions is lower than the overall surface of the remainder of the wafer. Then, when the $SiO_2$ region is formed for the SOI devices, the expansion of the SOI region will bring the surface of the SOI device area up to the overall surface of the wafer. A short Chemical Mechanical Polish (CMP) step may also be included to ensure uniformity of the wafer's surface.

The foregoing and other features and advantages of the present invention will be apparent from the following more particular description of preferred embodiments of the invention, as illustrated in the accompanying drawings.

BRIEF DESCRIPTION OF THE DRAWINGS

The preferred embodiments of the present invention will hereinafter be described by reference to the drawings, wherein like designations denote like elements, and.

BEST MODE FOR CARRYING OUT THE INVENTION

The present invention relates to the fabrication of integrated circuit devices, particularly SOI devices. For those individuals who are not familiar with CMOS and SOI devices, the Overview section below presents some basic concepts that will help to understand the invention. Those who are skilled in the art may wish to skip this section and begin with the Detailed Description Section instead.

1. Overview

Figure 1:
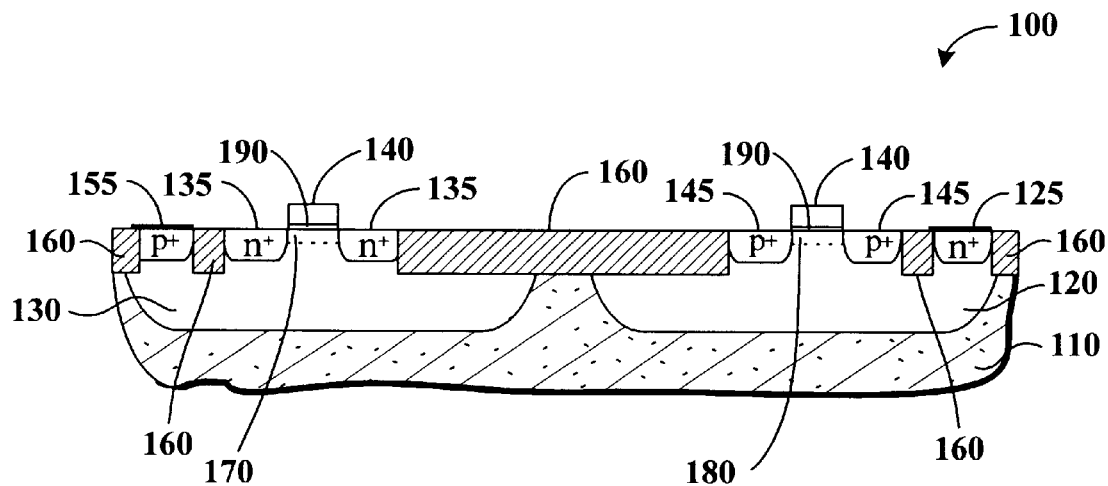
FIG. 1 is a side cross-sectional view of a portion of a bulk CMOS wafer.

Referring now to FIG. 1, a portion of a typical bulk CMOS (non-SOI) wafer 100 includes: a substrate 110; an n-well 120; an n-well contact 125; a p-well 130; n$^+$ source and drain diffusions 135; polysilicon gate contacts 140; p$^+$ source and drain diffusions 145; a p-well contact 155; device isolation regions 160; an n-channel 170; a p-channel 180; and a gate oxide 190.

The designation of a particular device as a p-channel device or an n-channel device depends on the type of fabrication process used to create the device. Substrate 110 is any semiconductor material known to those skilled in the art. The various wells and contacts are created by using different types of constituents when the wafer is being fabricated. In normal operation, n-well contact 125 is connected to $V_{DD}$ and p-well contact 155 is connected to ground.

Figure 2:
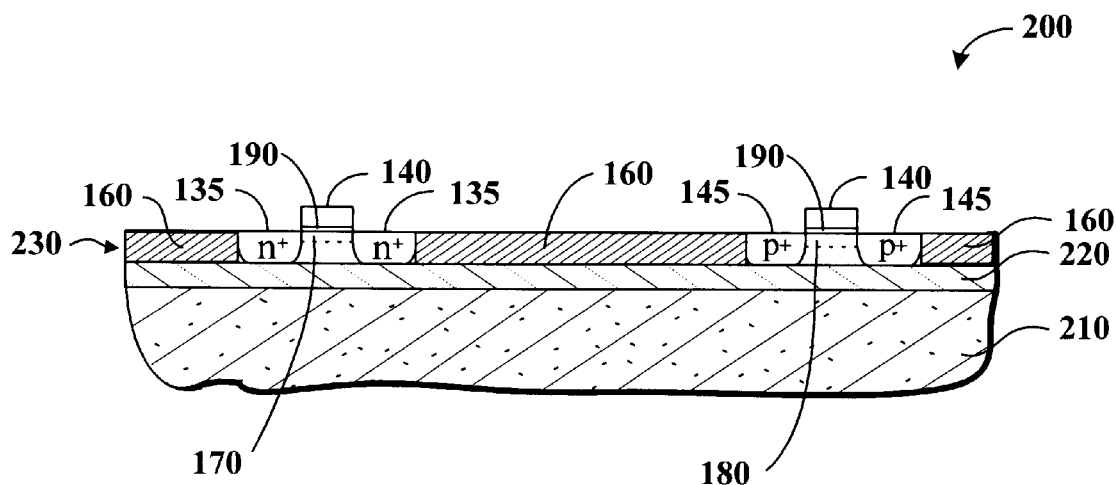
FIG. 2 is a side cross-sectional view of a portion of an SOI wafer.

Referring now to FIG. 2, a portion of a typical SOI wafer 200 includes: a substrate 210; polysilicon gate contacts 140; a buried oxide layer 220; and an active region 230. Active region 230 is a thin layer of silicon and includes n$^+$ source and drain diffusions 135; p$^+$ source and drain diffusions 145; device isolation regions 160; an n-channel 170; a p-channel 180; and gate oxide 190.

Substrate 210 is any semiconductor material, or metal, or glass, known to those skilled in the art. Source and drain diffusions 135 and 145 typically abut buried oxide layer 220. Device isolation regions 160 and buried oxide layer 220 serve to electrically isolate source and drain diffusions 135 and 145, preventing electrical charge from being transferred to and from the devices through substrate 210.

2. Detailed Description

Figure 3:
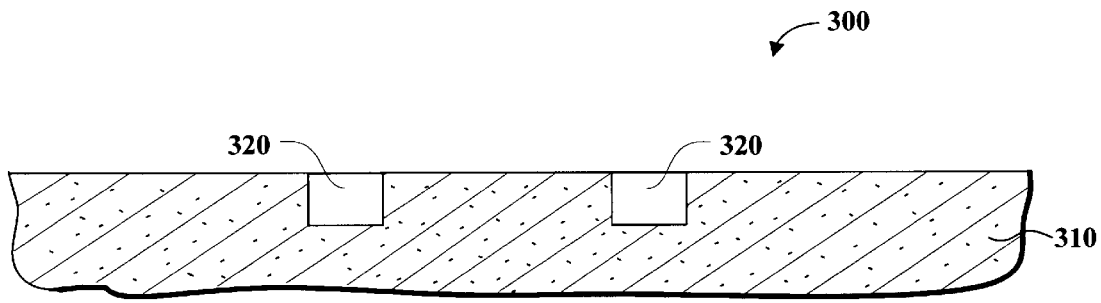
FIG. 3 is a side cross-sectional view of a semiconductor wafer showing two stress interface regions or Shallow Trench Isolation (STI) regions.

Referring now to FIG. 3, a wafer structure 300 suitable for use in a preferred embodiment of the present invention includes substrate 310 and stress interface regions 320.

Wafer structure 300 represents a small portion of a much larger wafer used to fabricate integrated circuit chips. Substrate 310 is any type of substrate material known to those skilled in the art. One example of a typical substrate material is silicon (Si). Substrate 310 will typically contain integrated circuit components such as P-well and N-well transistor gates and many other circuit components (not shown) which are well known to those skilled in the art. Typically, stress interface regions 320 are formed by etching the surface of the wafer, oxidizing the layer, growing or depositing oxide into the etched areas, and then polishing the surface of the wafer by standard Chemical Mechanical Polishing (CMP) processes.

A preferred embodiment of stress interface regions 320 may be formed by typical Shallow Trench Isolation (STI) processing methods. However, it should be noted that any processing method known to those skilled in the art may be used to form stress interface regions 320. Stress interface regions 320 may be any suitable semiconductor structure known to those skilled in the art, including but not limited to the oxide-filled trenches described herein. Although stress interface regions 320, in cross section, appear to be separate, isolated regions, they will typically be two different portions of the same feature on wafer structure 300. In a top view of wafer structure 300, stress interface regions 320 would appear as two separate points on a larger, stress interface region. Stress interface regions 320 may be formed simultaneously in the same process step with other STI regions or, alternatively, stress interface regions 320 may be formed independently in a separate process step.

Figure 4:
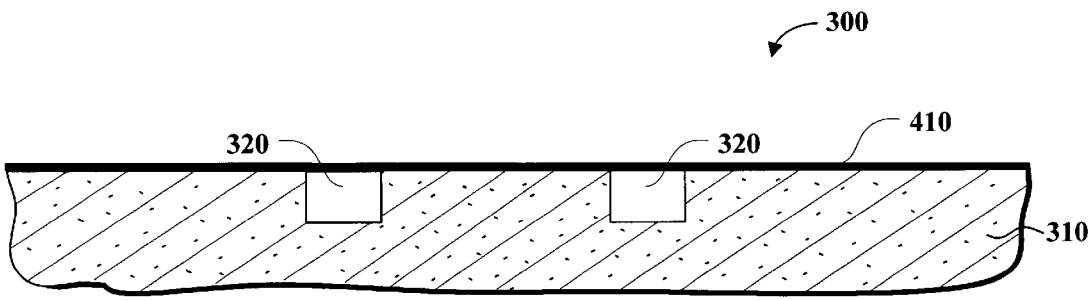
FIG. 4 is a side cross-sectional view of the semiconductor wafer of FIG. 3 with an etch-stop layer deposited over the surface.

Referring now to FIG. 4, wafer structure 300 of FIG. 3 is shown with a thin etch-stop layer 410 deposited over the surface of substrate 310 and stress interface regions 320. Etch-stop layer 410 may be formed from any suitable material which serves as an "etch-stop" layer or boundary material to mask and protect stress interface regions 320 and substrate 310 from subsequent etching steps. One suitable material for etch-stop layer 410 is nitride. The use of etch-stop materials is well-known to those skilled in the art.

Figure 5:
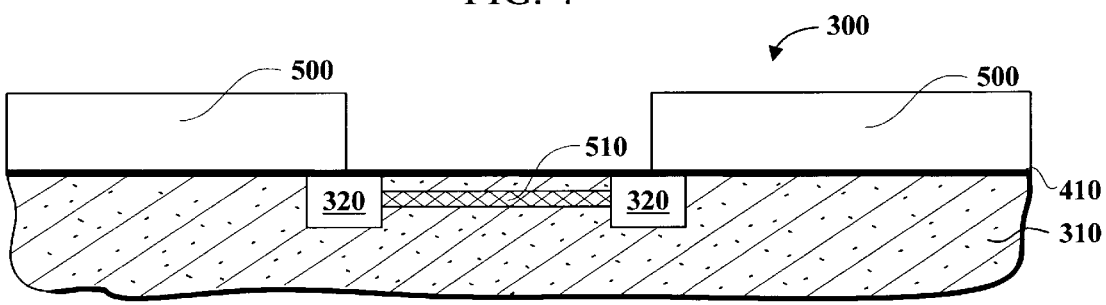
FIG. 5 is a side cross-sectional view of the semiconductor wafer of FIG. 4 with an implant region formed in the wafer.

Referring now to FIG. 5, an ion-implant mask 500 has been formed over the surface of etch-stop layer 410 and wafer structure 300. Ion-implant mask 500 is typically formed as part of a Chemical Vapor Deposition (CVD) process and must be thick enough to block the subsequent oxygen ion-implant. Ion-implant mask 500 may be formed from oxide, nitride, polysilicon, or any other suitable material which can withstand the ion-implant process temperature and perform the necessary function of masking certain areas from the ion-implant. Ion-implant mask 500 is patterned so as to terminate generally over the center of stress interface regions 320, thereby exposing the area between stress interface regions 320 to the ion-implantation to be provided in the next step. Typical implant species include charged atomic oxygen (O+), charged molecular oxygen ($O_2$+) or any other suitable material which may be used to fabricate implant region 510. After implant region 510 has been formed, ion-implant mask 500 and etch-stop layer 410 are stripped and removed by using standard wafer processing techniques. Following removal of ion-implant mask 500 and etch-stop layer 410, wafer structure 300 is placed in a wafer furnace and annealed at a temperature of 1300° C.–1400° C. for approximately 6 hours.

During the annealing step, the oxide in stress interface regions 320 is maintained at a temperature in excess of the glass transition temperature for oxide. This allows the oxide in stress interface regions 320 to become more of a liquid than a solid. This is important because during the annealing step, the implanted oxygen in implant region 510 reacts with the silicon in substrate 310 to form $SiO_2$ and expands in volume. The liquid-like characteristics of stress interface regions 320 relaxes the stress that normally occurs as implant region 510 expands.

Figure 6:
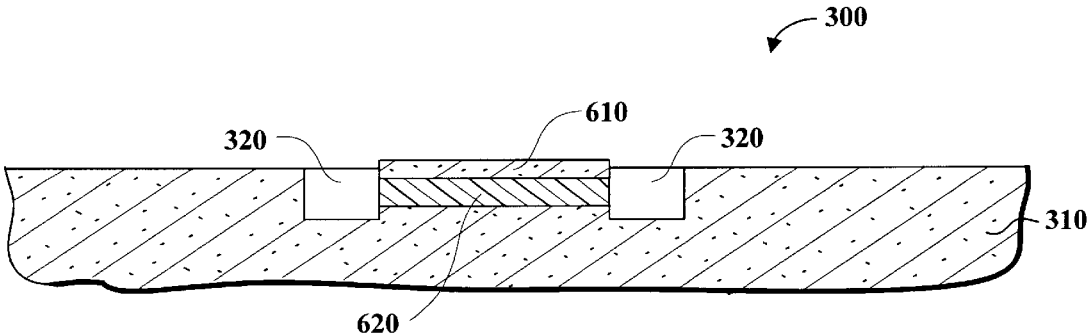
FIG. 6 is a side cross-sectional view of the semiconductor wafer of FIG. 5 with an SOI region formed.

Referring now to FIG. 6, after removal from the wafer furnace, wafer structure 300 is shown with a displaced silicon (Si) region 610 and Buried Oxide (BOX) region 620 which have been formed from implant region 510 as a result of the processing described above. When implant region 510 is oxidized it expands in volume. As a result, silicon region 610 is forced upwards by the expansion of implant region 510 because BOX region 620 has a much larger volume than the underlying silicon in substrate 310 from which it was formed. Stress interface regions 320 absorb the stress that is usually associated with the boundary between an SOI region and a non-SOI region on the surface of wafer structure 300, thereby allowing both SOI devices and non-SOI devices to be fabricated with an acceptable level of reliability. Stress interface regions 320 may be of any appropriate depth which will provide the necessary functionality described herein.

Figure 7:
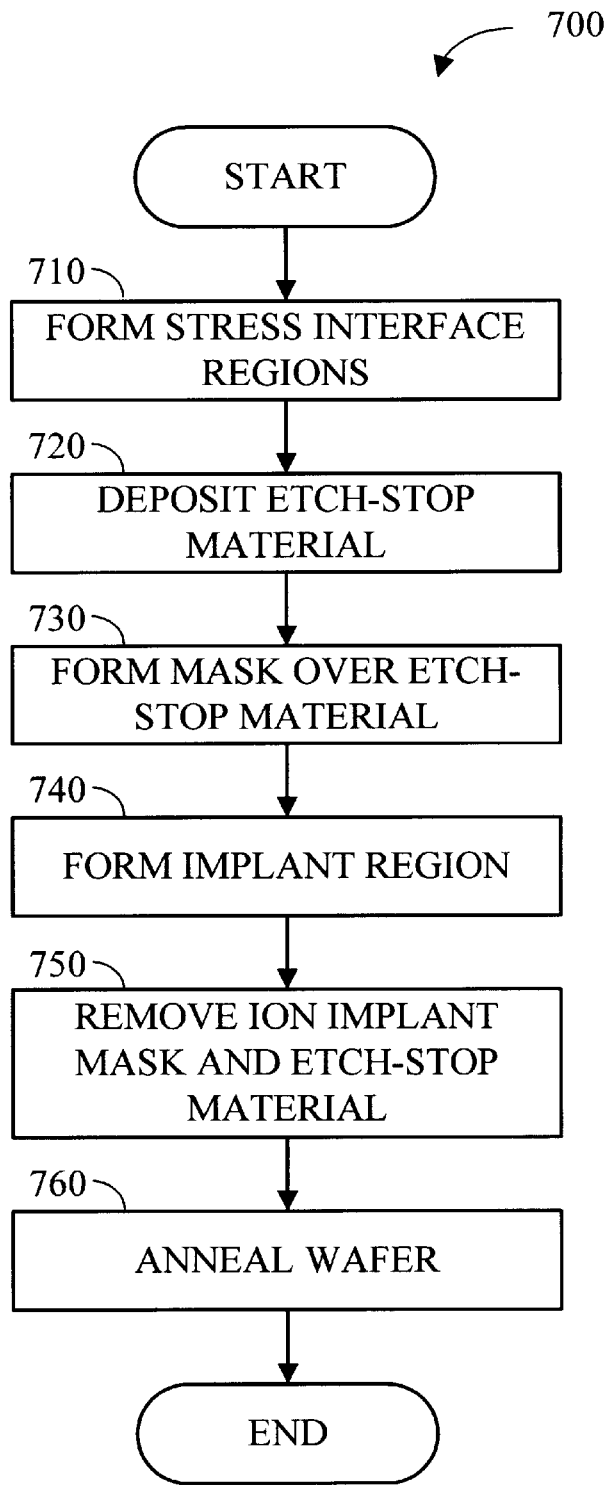
FIG. 7 is a flow chart of a method for fabricating a wafer according to a preferred embodiment of the present invention.

Referring now to FIG. 7, a general process method 700 for fabricating SOI devices and non-SOI devices on a single wafer is illustrated. As explained above, several stress interface regions are formed in a substrate material (step 710) and an etch-stop material such as nitride is deposited over the surface of the substrate (step 720). After the etch-stop material has been deposited, an ion-implant mask is formed, with the area between the stress interface regions being left exposed (step 730), and a buried ion-implant region is formed (step 740). After the ion-implant region has been formed, the ion-implant mask and the etch-stop layer are removed by conventional methods (step 750). Then, the wafer is annealed at a relatively high temperature to form a silicon region 610 overlying a BOX region 620 (step 760). As shown in FIG. 6, after the annealing step (step 760), the surface of wafer structure 300 will be comparatively uneven, with silicon region 610 being higher than the surrounding surface of wafer structure 300. This disparity in the surface of wafer structure 300 is undesirable for some applications and can be remedied with the addition of several processing steps, as explained below. The actual displacement of silicon region 610 has been exaggerated for purposes of illustration.

Figure 8:
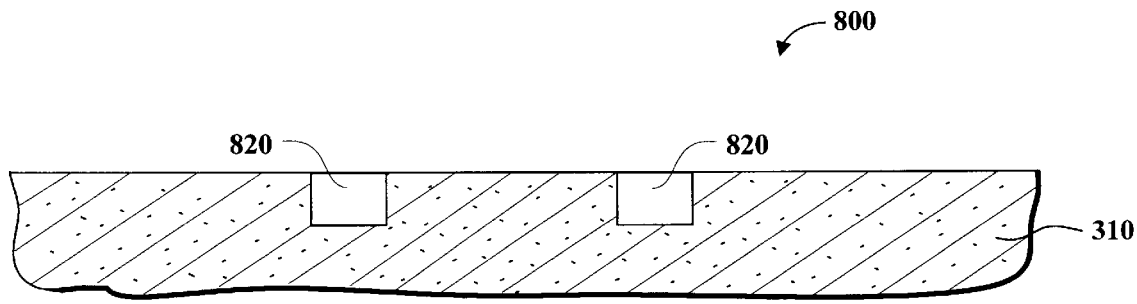
FIG. 8 is a side cross-sectional view of a semiconductor wafer with a pair of Shallow Trench Isolation (STI) regions.

Referring now to FIG. 8, a wafer structure 800 suitable for use in a preferred embodiment of the present invention includes substrate 810 and stress interface regions 820. Wafer structure 800 represents a small portion of a much larger wafer used to fabricate integrated circuit chips. Substrate 810 is any type of substrate material known to those skilled in the art. One example of a typical substrate material is silicon (Si). Substrate 810 will typically contain integrated circuit components such as P-well and N-well transistor gates and many other circuit components (not shown) which are well known to those skilled in the art.

As explained above, stress interface regions 820 are typically formed by etching the surface of the wafer, oxidizing the layer, growing or depositing oxide into the etched areas and then polishing the surface of the wafer by standard Chemical Mechanical Polishing (CMP) processes. It should be noted that any processing method known to those skilled in the art may be used to form stress interface regions 820. Stress interface regions 820 may be any suitable semiconductor structure known to those skilled in the art, including but not limited to the oxide-filled trenches described herein.

Figure 9:
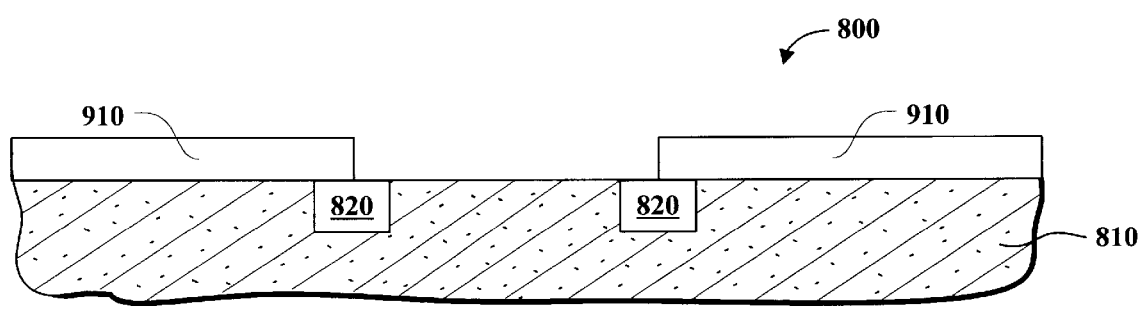
FIG. 9 is a side cross-sectional view of the semiconductor wafer of FIG. 8 with a etch mask in place.

Referring now to FIG. 9, a portion of the surface of wafer structure 800 is covered with an etchant mask 910 which will prevent the masked areas from being etched during a subsequent processing step. Etchant mask 910 may be formed by any process known to those skilled in the art. Etchant mask 910 is patterned so as to terminate generally over stress interface regions 820, thereby exposing the area between stress interface regions 820 to the etchant to be provided in the next step.

Figure 10:
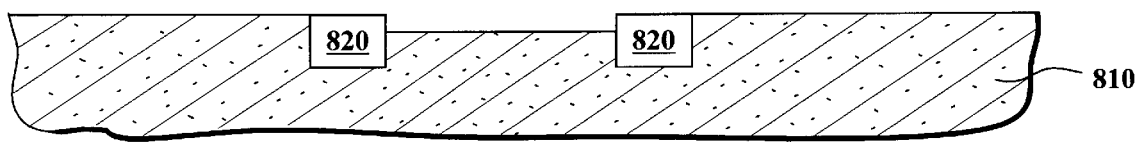
FIG. 10 is a side cross-sectional view of the semiconductor wafer of FIG. 9 with a portion of the surfaced etched away.

Referring now to FIG. 10, a portion of substrate 810 lying between stress interface regions 820 has been etched away. In addition, etchant mask 910 has been stripped away. The processes used to etch silicon and remove etchant masks is well known to those skilled in the art.

Figure 11:
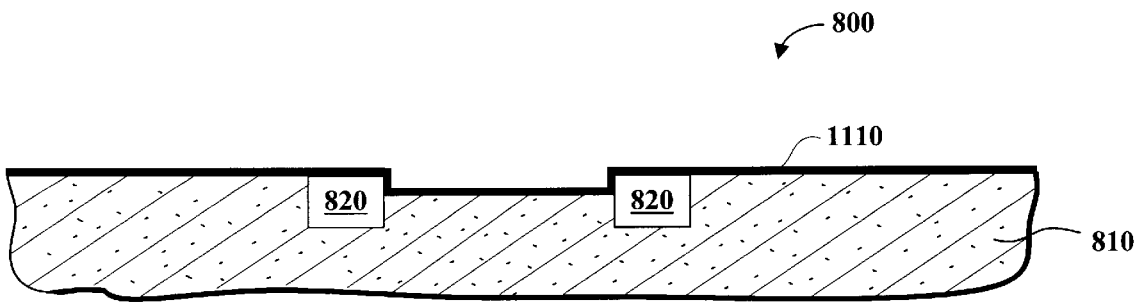
FIG. 11 is a side cross-sectional view of the semiconductor wafer of FIG. 10 with an etch-stop layer deposited over the surface.

Referring now to FIG. 11, wafer structure 800 of FIG. 10 is shown with a thin etch-stop layer 1110 deposited over the surface of substrate 810 and stress interface regions 820. Etch-stop layer 1110 may be formed from any suitable material which serves as an "etch-stop" layer or boundary material to mask and protect stress interface regions 820 and substrate 810 from subsequent etching steps. One suitable material for etch-stop layer 1110 is nitride. The use of etch-stop materials is well-known to those skilled in the art.

Figure 12:
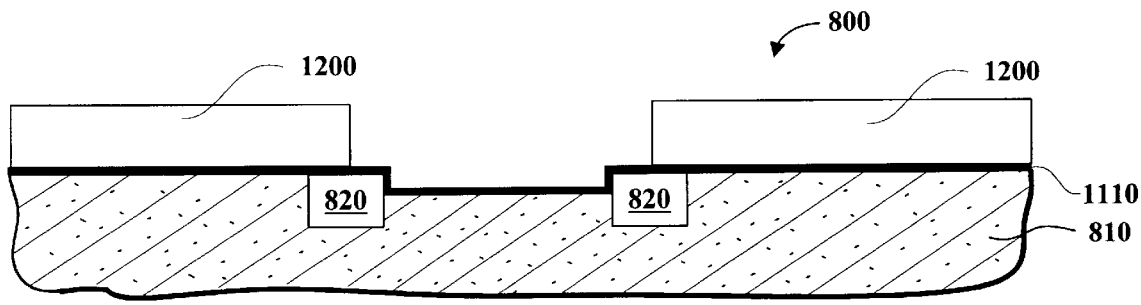
FIG. 12 is a side cross-sectional view of the semiconductor wafer of FIG. 11 with an ion-implant mask covering a portion of the wafer.

Referring now to FIG. 12, an ion-implant mask 1200 has been formed over the surface of etch-stop layer 1110 and wafer structure 800. Ion-implant mask 1200 is typically formed as part of a Chemical Vapor Deposition (CVD) process and must be thick enough to block the subsequent oxygen ion-implant. Ion-implant mask 1200 may be formed from oxide, nitride, polysilicon, or any other suitable material which can withstand the ion-implant process temperature and perform the necessary function of masking certain areas from the ion-implant. Ion-implant mask 1200 is patterned so as to terminate over the center of stress interface regions 820, thereby exposing the area between stress interface regions 820 to the ion-implantation provided in the next step.

Figure 13:
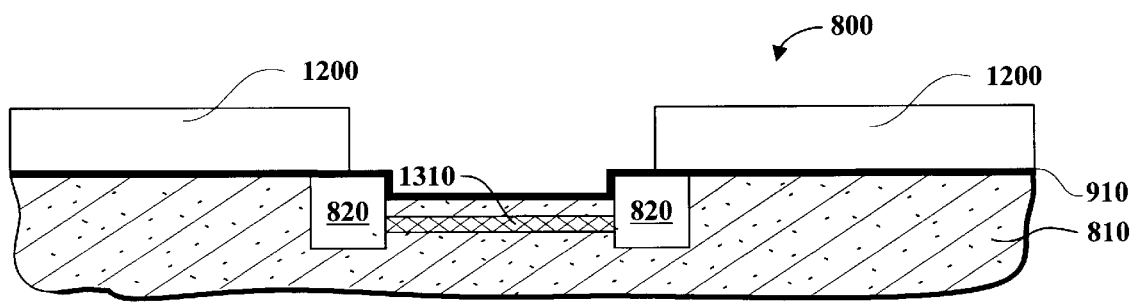
FIG. 13 is a side cross-sectional view of the semiconductor wafer of FIG. 12 with an implant region formed in the wafer.

Referring now to FIG. 13, an ion-implant region 1310 has been formed in wafer substrate 810. Typical implant species include, charged atomic oxygen (O+), charged molecular oxygen ($O_2$+), or any other suitable material which may be used to fabricate an implant region. After implant region 1310 has been formed, ion-implant mask 1200 and etch-stop layer 1110 are stripped and removed by using standard wafer processing techniques. Following removal of ion-implant mask 1200 and etch-stop layer 1110, wafer structure 800 is placed in a wafer furnace and annealed at a temperature of 1300° C.–1400° C. for approximately 6 hours.

During the annealing step, the oxide in stress interface regions 820 is maintained at a temperature in excess of the glass transition temperature for oxide. This allows the oxide in stress interface regions 820 to become more of a liquid than a solid. This is important because during the annealing step, the implanted oxygen in implant region 1310 reacts with the silicon in substrate 810 to form $SiO_2$ and expands in volume. The liquid-like characteristics of stress interface regions 820 relaxes the stress that normally occurs as implant region 1310 expands.

Figure 14:
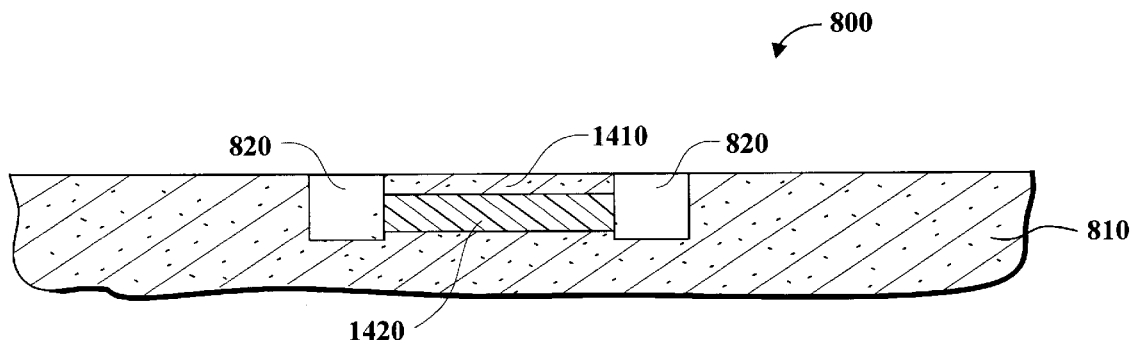
FIG. 14 is a side cross-sectional view of the semiconductor wafer of FIG. 13 with an SOI region formed.

Referring now to FIG. 14, after removal from the wafer furnace, wafer structure 300 is shown with a displaced silicon (Si) region 1410 and Buried Oxide (BOX) region 1420 which have been formed from implant region 1310 as a result of the processing described above. When implant region 1310 is oxidized it expands in volume. As a result, silicon region 1410 is forced upwards by the expansion of implant region 1310 because BOX region 1420 has a much larger volume than the underlying silicon in substrate 810 from which it was formed. Stress interface regions 820 absorb the stress that is usually associated with the boundary between an SOI region and a non-SOI region on the surface of wafer structure 800, thereby allowing both SOI devices and non-SOI devices to be fabricated with an acceptable level of reliability.

Figure 15:
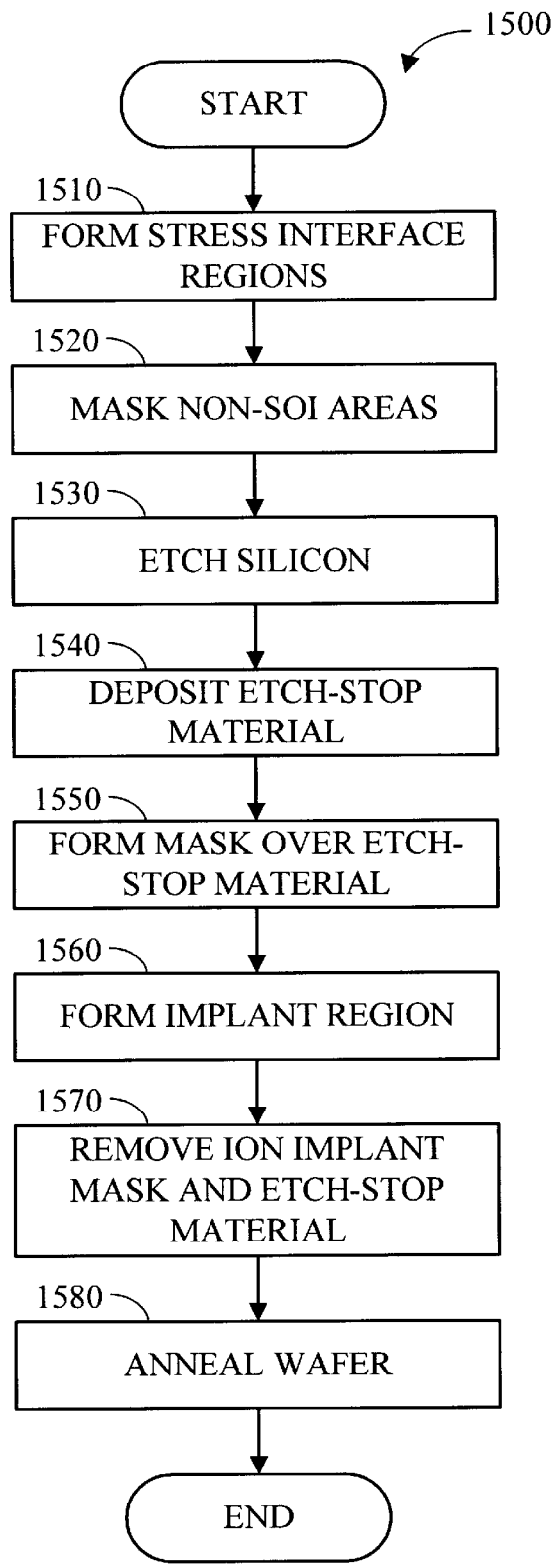
FIG. 15 is a flow chart of a method for fabricating a wafer according to an alternative preferred embodiment of the present invention.

Referring now to FIG. 15, a general process method 1500 for fabricating SOI devices and non-SOI devices on a single wafer while maintaining a co-planar surface is illustrated. This method is substantially similar to the method explained above in conjunction with FIG. 7. Steps 1510, 1540, and 1550 correspond to steps 710, 720, and 730, respectively. Further, steps 1560, 1570, and 1580 correspond to steps 740, 750, and 760, respectively. In addition, several other process steps have been added. Specifically, after stress interface regions 820 have been formed, the area of wafer 810 where the non-SOI devices are to be formed are masked (step 1520) and the silicon in the area where the SOI devices are to be formed is etched using any conventional etching process (step 1530).

These additional process steps result in the surface of the substrate located between stress interface regions 820 being lower than the surface of the rest of wafer structure 800. Then, after the annealing step is performed (step 1570), the expansion of implant region 1310 will cause the surface of silicon region 1410 located between stress interface regions 820 to be substantially co-planar with the rest of the surface of wafer structure 800. This step may optionally be followed with a Chemical-Mechanical Polishing (CMP) process step to increase the uniformity of the surface of wafer structure 800.

The embodiments and examples set forth herein were presented in order to best explain the present invention and its practical application and to thereby enable those skilled in the art to make and use the invention. Many modifications and variations are possible in light of the above teaching without departing from the spirit and scope of the forthcoming claims. For example, the addition of boron or phosphorous mixed in with the oxide in stress interface regions 320 and 820 will reduce the glass transition temperature and, in turn, allow the annealing step to take place at a lower temperature. In addition, the actual depth of stress interface regions 320 and 820 can be adjusted so that BOX regions 620 and 1420 may be formed at many different points below the surface of the wafer. However, those skilled in the art will recognize that the foregoing description and examples have been presented for the purposes of illustration and example only. The description as set forth is not intended to be exhaustive or to limit the invention to the precise form disclosed.

We claim:

1. A method for fabricating both SOI and non-SOI devices on a single wafer, the method comprising the steps of:

identifying a first stress interface region in a wafer substrate;

identifying a second stress interface region in the wafer substrate;

depositing a layer of etch-stop material over the substrate and the first and second stress interface regions;

forming an ion-implant mask on the etch-stop material, wherein the ion-implant mask does not cover the etch-stop material located between the first and second stress interface regions;

forming a buried implant region between the first and second stress interface regions;

removing the ion-implant mask material and the etch-stop material; and annealing the wafer to transform the buried implant region into an isolation region.

2. The method of claim 1, further comprising the step of fabricating at least one SOI device in an area over the isolation region.

3. The method of claim 2, further comprising the step of fabricating at least one non-SOI device outside the area over the isolation region.

4. The method of claim 1, further comprising the steps of:
    fabricating at least one SOI device in an area over the isolation region; and
    fabricating at least one non-SOI device outside the area over the isolation region.

5. The method of claim 1, further comprising the step of polishing the wafer surface using a CMP process.

6. The method of claim 1, wherein the steps of identifying a first stress interface region and a second stress interface region in the wafer substrate comprises the step of identifying two different locations on a single wafer feature.

7. A method for fabricating both SOI and non-SOI devices on a single wafer, the method comprising the steps of:
    identifying a first stress interface region in a wafer substrate;
    identifying a second stress interface region in the wafer substrate;
    depositing a layer of etch-stop material over the substrate and the first and second stress interface regions;
    forming an ion-implant mask on the etch-stop material, wherein the ion-implant mask does not cover the etch-stop material located between the first and second stress interface regions;
    forming a buried implant region between the first and second stress interface regions;
    removing the ion-implant mask material and the etch-stop material; and
    annealing the wafer to transform the implant region into an isolation region;
    fabricating SOI devices in an area over the isolation region;
    fabricating non-SOI devices outside the area over the isolation region; and
    polishing the surface of the wafer using a CMP process.

8. A method for fabricating a single wafer with a co-planar wafer surface with both SOI and non-SOI devices on the wafer, the method comprising the steps of:
    identifying a first stress interface region in a wafer substrate;
    identifying a second stress interface region in the wafer substrate;
    etching away a portion of the wafer substrate located between the first and second stress interface regions;
    depositing an etch-stop material over the wafer substrate;
    forming an ion-implant mask on the etch-stop material, wherein the mask does not cover the etch-stop material located between the first and second stress interface regions;
    forming a buried implant region between the first and second stress interface regions; and
    annealing the wafer to transform the implant layer into an isolation region.

9. The method of claim 8, further comprising the step of polishing the wafer surface using a CMP process.

10. The method of claim 8, further comprising the step of fabricating at least one SOI device in an area over the isolation region.

11. The method of claim 10, further comprising the step of fabricating at least one non-SOI device outside the area over the isolation region.

12. The method of claim 8, further comprising the steps of:
    fabricating at least one SOI device in an area over the isolation region; and
    fabricating at least one non-SOI device outside the area over the isolation region.

13. The method of claim 8, wherein the steps of identifying a first stress interface region and a second stress interface region in the wafer substrate comprises the step of identifying two different locations on a single wafer feature.

14. A method for fabricating a single wafer with a co-planar wafer surface with both SOI and non-SOI devices on the wafer, the method comprising the steps of:
    forming a first stress interface region in a wafer substrate;
    forming a second stress interface region in the wafer substrate;
    masking an area of the wafer substrate outside the first and second stress interface regions;
    etching away a portion of the wafer substrate located between the first and second stress interface regions;
    depositing an etch-stop material over the wafer substrate;
    forming an ion-implant mask on the etch-stop material, wherein the mask does not cover the etch-stop material located between the first and second stress interface regions;
    forming a buried implant region between the first and second stress interface regions;
    annealing the wafer to transform the buried implant region into an isolation region;
    polishing the wafer surface using a CMP process;
    fabricating SOI devices in an area over the isolation region; and
    fabricating non-SOI devices outside the area over the isolation region.

15. The method of claim 14, wherein the steps of forming a first stress interface and forming a second stress interface region are performed at the same time.

16. The method of claim 14, wherein the steps of forming a first stress interface and forming a second stress interface region comprise the steps of:
    creating a trench in the wafer; and
    filling the trench with an oxide.

17. The method of claim 14, wherein the steps of forming a first stress interface and forming a second stress interface region further comprise the step of combining boron with the oxide used to fill the trench.

18. The method of claim 14, wherein the steps of forming a first stress interface and forming a second stress interface region further comprise the step of combining phosphorous with the oxide used to fill the trench.

19. The method of claim 14, wherein the steps of forming a first stress interface region and a second stress interface region in the wafer substrate comprises the step of forming a single wafer feature.

20. A method of making a dual wafer comprising the steps of:
    forming a pair of STI regions in a wafer substrate;
    depositing a layer of etch-stop over the substrate and the STI regions;
    forming a mask on the etch-stop terminating over the STI regions wherein there is substantially no mask on the etch-stop between the STI regions;
    implanting into the substrate between the STI regions including forming an implant layer; and
    annealing the wafer to transform the implant layer into an isolation layer.

* * * * *